(12) United States Patent
Fu et al.

(10) Patent No.: US 11,936,403 B2
(45) Date of Patent: *Mar. 19, 2024

(54) SYSTEMS AND METHODS FOR DECODING CODEWORDS IN A SAME PAGE WITH HISTORICAL DECODING INFORMATION

(71) Applicant: Innogrit Technologies Co., Ltd., Shanghai (CN)

(72) Inventors: Bo Fu, Cupertino, CA (US); Jie Chen, Milpitas, CA (US); Han Zhang, San Jose, CA (US); Zining Wu, Los Altos, CA (US)

(73) Assignee: Innogrit Technologies Co., Ltd., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/079,738

(22) Filed: Dec. 12, 2022

(65) Prior Publication Data

US 2023/0107784 A1 Apr. 6, 2023

Related U.S. Application Data

(63) Continuation of application No. 17/492,730, filed on Oct. 4, 2021, now Pat. No. 11,569,847.

(51) Int. Cl.
*H03M 13/00* (2006.01)
*H03M 13/25* (2006.01)
*H03M 13/45* (2006.01)

(52) U.S. Cl.
CPC ..... *H03M 13/6561* (2013.01); *H03M 13/253* (2013.01); *H03M 13/451* (2013.01); *H03M 13/6575* (2013.01)

(58) Field of Classification Search
CPC .............. H03M 13/6561; H03M 13/253
See application file for complete search history.

(56) References Cited

U.S. PATENT DOCUMENTS

| | | | | |
|---|---|---|---|---|
| 6,526,531 B1* | 2/2003 | Wang | ............... | H03M 13/2957 714/704 |
| 8,255,763 B1* | 8/2012 | Yang | ............... | H03M 13/2957 714/755 |
| 8,429,498 B1* | 4/2013 | Anholt | ............... | G06F 11/1048 714/764 |
| 8,443,267 B2* | 5/2013 | Zhong | ............... | H03M 13/3715 714/780 |
| 9,160,373 B1* | 10/2015 | Varnica | ............. | H03M 13/1102 |

(Continued)

*Primary Examiner* — Joseph D Torres
(74) *Attorney, Agent, or Firm* — IPro, PLLC

(57) ABSTRACT

Systems and methods are provided for decoding data read from non-volatile storage devices. A method that may include decoding a first codeword read from a storage location of a non-volatile storage device using a first decoder without soft information, determining that the first decoder has failed to decode the first codeword, decoding the first codeword using a second decoder without soft information, determining that the second decoder has succeeded in decoding the first codeword, generating soft information associated with the storage location using decoding information generated by the second decoder and decoding a subsequent codeword from the storage location using the soft information associated with the storage location. The second decoder may be more powerful than the first decoder.

20 Claims, 5 Drawing Sheets

(56) References Cited

U.S. PATENT DOCUMENTS

| | | | |
|---|---|---|---|
| 2012/0079355 A1* | 3/2012 | Patapoutian | H03M 13/1108 |
| | | | 714/780 |
| 2013/0173982 A1* | 7/2013 | Moon | H03M 13/3761 |
| | | | 714/752 |
| 2020/0127685 A1* | 4/2020 | Chen | H03M 13/152 |
| 2020/0373944 A1* | 11/2020 | Cho | G06F 11/1048 |

* cited by examiner

SYSTEMS AND METHODS FOR DECODING CODEWORDS IN A SAME PAGE WITH HISTORICAL DECODING INFORMATION

TECHNICAL FIELD

The disclosure herein relates to decoding data encoded with parity check data, particularly relates to decoding encoded data using soft information generated from previous decoding operations.

BACKGROUND

One issue common to many data communication or storage systems is the corruption of data, for example, by noise in a communication channel or write/read processes in a storage system. One technique to remedy the data corruption is to use an error-correcting code (ECC) or forward error correction (FEC). Both ECC and FEC add redundant data or parity data to user data such that user data can be recovered by a receiver or reader even when a number of errors (up to the capability of the code being used) were introduced, for example, during the process of transmission or corruption on a storage.

A lot of different coding schemes have been developed over the years, for example, Hamming codes, Reed-Solomon codes, Turbo codes, etc. More recently, low density parity check (LDPC) codes have become widely used. All these codes, however, are computation complex and the techniques for using these codes are still in need of improvements.

SUMMARY

Disclosed herein may include a method that may comprise: decoding a first codeword read from a storage location of a non-volatile storage device using a first decoder without soft information, determining that the first decoder has failed to decode the first codeword, decoding the first codeword using a second decoder without soft information, determining that the second decoder has succeeded in decoding the first codeword, generating soft information associated with the storage location using decoding information generated by the second decoder and decoding a subsequent codeword from the storage location using the soft information associated with the storage location. The second decoder may be more powerful than the first decoder.

In another embodiment, there is provided a storage system controller that may comprise a plurality of error-correcting code (ECC) decoders including a first decoder and a second decoder, an ECC decoder controller and a soft information generator. The second decoder may be more powerful than the first decoder. The ECC decoder controller may be configured to: direct a first codeword read from a storage location of a non-volatile storage device to the first decoder for the first codeword to be decoded by the first decoder without soft information, determine that the first decoder has failed to decode the first codeword, direct the first codeword to the second decoder for the first codeword to be decoded by the second decoder without soft information, and determine that the second decoder has succeeded in decoding the first codeword. The soft information generator may be configured to generate soft information associated with the storage location using decoding information generated by the second decoder. One of the plurality of decoders may be configured to decode a subsequent codeword from the storage location using the soft information associated with the storage location generated by the soft information generator.

In yet another exemplary embodiment, disclosed herein may also include a non-transitory machine-readable medium having executable instructions. The executable instructions, when executed by a storage controller, may cause the storage controller to: decode a first codeword read from a storage location of a non-volatile storage device using a first decoder without soft information, determine that the first decoder has failed to decode the first codeword, decode the first codeword using a second decoder without soft information, determine that the second decoder has succeeded in decoding the first codeword, generate soft information associated with the storage location using decoding information generated by the second decoder and decode a subsequent codeword from the storage location using the soft information associated with the storage location. The second decoder may be more powerful than the first decoder.

DETAILED DESCRIPTION

Figure 1:
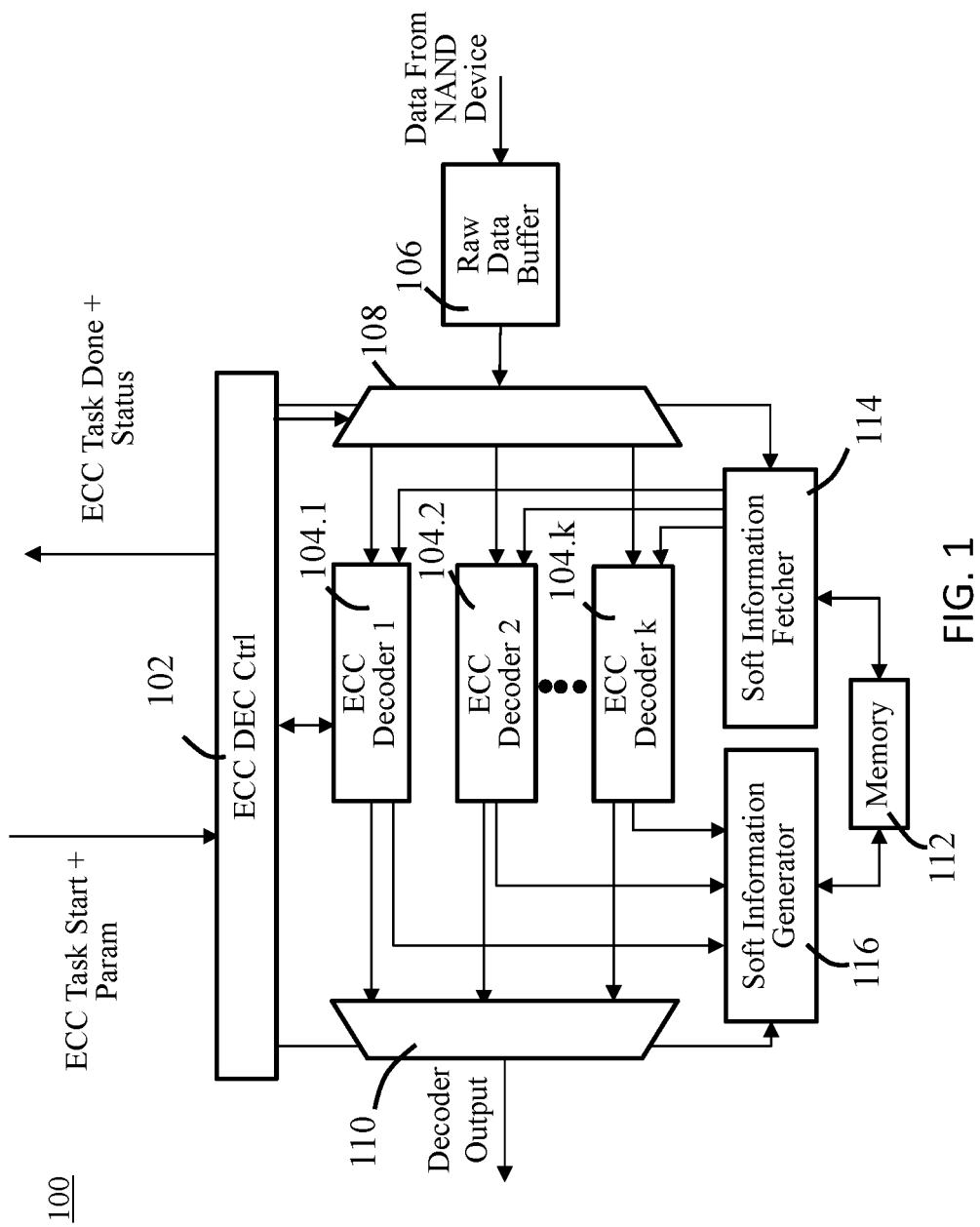
FIG. 1 schematically shows a storage controller for a non-volatile storage system in accordance with an embodiment of the present disclosure.

Specific embodiments according to the present disclosure will now be described in detail with reference to the accompanying figures. Like elements in the various figures are denoted by like reference numerals for consistency.

The present disclosure provides apparatuses, systems and methods for decoding data stored in non-volatile memory (NVM) storage devices that are encoded with an error-correcting code (ECC). FIG. 1 schematically shows a controller 100 for a non-volatile storage system in accordance with an embodiment of the present disclosure. The storage controller 100 may comprise an ECC Decoder Controller 102, a plurality of ECC decoders 104.1 to 104.K, a raw data buffer 106, a demultiplexer 108, a multiplexer 110, a memory 112, a soft information fetcher 114, and a soft information generator 116. The storage controller 100 may be used in a non-volatile storage system that has one or more non-volatile storage devices (e.g., NAND devices). Data read from the non-volatile storage devices may be received at the raw data buffer 106 and sent to the plurality of decoders 104.1 to 104.K via the demultiplexer 108. The raw data buffer 106 may comprise one or more buffer modules and the memory 112 may comprise one or more memory modules.

The ECC Decoder Controller 102 may be implemented in a hardware circuit block with functions implemented in hardware, or a central processing unit (CPU) or a graphics processing unit (GPU) with functions implemented by software, or a combination of software and hardware. In some embodiments, when performing a read operation, the ECC Decoder Controller 102 may receive an ECC Task Start signal with one or more parameters. The ECC Decoder Controller 102 may send a signal to the demultiplexer 108 for the demultiplexer 108 to transmit data in the raw data buffer 106 to one or more ECC decoders of the plurality of ECC decoders 104.1 to 104.K.

In various embodiments, at least some of the plurality of ECC decoders 104 may have different decoding capabilities. For example, a more powerful decoder may correct more errors than a less powerful decoder. For illustration purpose, a decoder with a higher index value may be more power full that a decoder with a lower index value. For example, decoder 104.2 may be more powerful than decoder 104.1 but less powerful than decoder 104.3, and decoder 104.K may be the most powerful decoder among the plurality of ECC decoders 104.1 to 104.K, with K being a positive integer.

The plurality of ECC decoders 104.1 to 104.K may decode data received from the raw data buffer 106, and decoded data may be output via the multiplexer 110. In various embodiments, each of the plurality of ECC decoders 104.1 to 104.K may be configured to perform decoding operations on codewords individually. During or after the decoding operation for a codeword, decoding information may be generated. For example, at the end of a successful decoding operation for a codeword, some bits of the codeword may be flipped from logical one (1) to logical zero (0) (denoted as Error Flipping Count of 1 to 0 or $EFC_{1->0}$) and some other bits of the codeword may be flipped from logical 0 to logical 1 (denoted as Error Flipping Count of 0 to 1 or $EFC_{0->1}$). These two Error Flipping Counts may be useful decoding information collected by a decoder and sent to the soft information generator 116.

The soft information generator 116 may be coupled to each of the plurality of decoders 104.1 to 104.K to receive decoding information generated by decoders in decoding operations. For example, the soft information generator 116 may receive a signal from the ECC Decoder Controller 102 indicating that the ECC decoding task for a codeword is successfully finished and generate soft information from the decoding information. In one embodiment, the generated soft information may be a difference between to error flipping counts, which may be represented by $EFC_{1->0}$ minus $EFC_{0->1}$ (e.g., $EFC_{1->0}-EFC_{0->1}$). The generated soft information may be sent to the memory 112.

Codewords read from the same storage location may share the same error characteristics (e.g., the degraded reliability of the storage cells of the non-volatile storage device with the increase of Program/Erase cycle). For example, a page of a non-volatile storage device may be the minimum size unit that may be programmed (e.g., written) and read, and codewords read from the same page may share the same characteristics. The soft information generated at the soft information generator 116 may indicate whether state 1 or state 0 is more reliable for data read from one storage location. Each storage location may have an associated unique identifier, for example, for a page, the unique identifier may be a physical page address (PPA). The generated soft information may be associated with the unique identifier and used for decoding other codewords from the same storage location.

In some embodiments, each time any one of the plurality of ECC decoders 104 successfully decodes a codeword read from a storage location, decoding information may be generated and sent to the soft information generator 116. The soft information generator 116 may search the memory 112 by the unique identifier associated with the storage location, retrieve existing soft information associated with the unique identifier, update the soft information using newly generated decoding information and save the updated soft information to the memory 112.

In one embodiment, updating the soft information may be performed by calculating an average of the difference of the error flipping counts (e.g., $\overline{EFC_{1->0}-EFC_{0->1}}$) and the average of the difference between the two error flipping counts may be saved in the memory 112. For example, the soft information generator 116 may retrieve an existing $\overline{EFC_{1->0}-EFC_{0->1}}$ from the memory 112, and update this average using the newly generated decoding information from the most recent decoding of a codeword from the same storage location, new $\overline{EFC_{1->0}-EFC_{0->1}}$=(existing $\overline{EFC_{1->0}-EFC_{0->1}}$+new value of $EFC_{1->0}-EFC_{0->1}$)/2. It should be noted that after decoding the first codeword, $\overline{EFC_{1->0}-EFC_{0->1}}=EFC_{1->0}-EFC_{0->1}$.

It should be noted that the soft information may be generated by hardware or software. In various embodiments, the soft information generator 116 may be implemented in hardware or software. For example, in one embodiment, the soft information generator 116 may be implemented as software executed in a processor. But in another embodiment, the soft information generator 116 may be implemented in hardware circuits.

Each of the plurality of decoders 104.1 to 104.K may use soft information for soft decision decoding if relevant soft information is available. Therefore, each of the plurality of decoders 104.1 to 104.K may also be coupled to the soft information fetcher 114. When data read from a storage location needs to be decoded, the soft information fetcher 114 may search for soft information in the memory 112 by the unique identifier associated with the storage location and fetch soft information for the page from the memory 112 if the soft information for the storage location is found.

It should be noted that soft information not generated by the soft information generator 116, such as the conventional soft information obtained by reading the same data from a non-volatile storage device multiple times may also be obtained from the non-volatile storage device and used by the soft decision decoding in some embodiments. For example, in one embodiment, if soft information cannot be fetched from the memory 112, conventional soft information may be obtained from the non-volatile storage device and used by one of the ECC decoder 104.1 to 104.K.

The storage controller 100 may implement a multi-level and multi-round error correction scheme. For example, when a plurality of codewords from a storage location are read into the raw data buffer 106, the ECC Decoder Controller 102 may try to let a first decoder (e.g., ECC decoder 104.1) to decode a first codeword of the plurality of codewords. The soft information fetcher 114 may search the memory 112 by a unique identifier associated with the storage location. At this time, there may be no soft information associated with the storage location in the memory 112 and the soft information fetcher 114 may fail to fetch any soft information for this storage location. The first decoder may try to decode the first codeword without any soft information in a first decoding operation.

The first decoding operation may fail and the failure may trigger a second decoder, which may be a next higher-level decoder (e.g., ECC decoder 104.2). In one embodiment, but not in all embodiments, the soft information fetcher 114 may try again to fetch soft information for this storage location but fails. The next higher-level decoder may try to decode the first codeword without any soft information. A third decoder may be triggered to try to decode the first codeword if the second decoder also fails to decode the first codeword. And this triggering of a next higher-level decoder may continue until the highest-level decoder is tried. Thus, the first codeword may be tried in multiple rounds of decoding operations by different levels of decoders.

If any of the higher-level decoder successfully decode the codeword, soft information may be generated from decoding information collected from that higher-level decoder. For example, if the second decoder successfully decodes the first codeword, decoding information (e.g., $EFC_{1->0}$ and $EFC_{0->1}$) may be collected by the second decoder and sent to the soft information generator 116. The soft information generator 116 may generate soft information associated with the storage location and send it to the memory 112.

In some embodiments, while the first codeword may be escalated to the second decoder (or even a higher level decoder if the second decoder also fails), the ECC Decoder Controller 102 may let the first decoder try to decode a subsequent codeword of the plurality of codewords (e.g., second codeword, third codeword, etc. from the same page). If the soft information has been generated from decoding information from the second (or even higher level) decoder after decoding the first codeword successfully, the generated soft information may be used by any decoder to help decode the subsequent codeword whenever the generated soft information becomes available.

For example, if when the first decoder tries to decode a subsequent codeword, the soft information has already been generated and available from the memory 112, the first decoder may decode the subsequent codeword successfully using the soft information. If, however, the soft information is still not available from the memory 112, the first decoder may fail to decode the subsequent codeword and the subsequent codeword may be escalated to the second decoder. By this time, soft information associated with the storage location may have been generated and saved in the memory 112 and the soft information fetcher 114 may successfully fetch the soft information. The second decoder now may decode the subsequent codeword successfully with the soft information associated with the storage location.

If after the soft information becomes available, a decoder still fails to decode a subsequent codeword, the failure may trigger the next higher-level decoder to try decoding the subsequent codeword with the soft information and this escalation to a next higher-level decoder may continue until a decoder may decode the subsequent codeword with the soft information.

Whenever a decoder successfully decodes a subsequent codeword, the decoding information may be collected by that decoder and sent to the soft information generator 116. The soft information generator 116 may retrieve the soft information used in decoding the subsequent codeword from the memory 112 and update the soft information, for example, by calculating or updating an average of the difference of the error flipping counts (e.g., $\overline{EFC_{1 \to 0} - EFC_{0 \to 1}}$) with the new value of error flipping counts in the most recent successful decoding operation. By using the soft information associated with the storage location for decoding subsequent codeword(s), the subsequent codeword(s) may be decoded much faster.

In one embodiment, the storage controller 100 may be a controller for a non-volatile storage system 100 such as, but not limited to, a solid-state drive (SSD). Moreover, in one embodiment, the ECC Decoder Controller 102, the plurality of ECC decoders 104, the raw data buffer 106, the demultiplexer 108, the multiplexer 110, the soft information fetcher 114 and the soft information generator 116 may be integrated in one storage system controller chip (e.g., an integrated circuit (IC) chip), while the memory 112 may be coupled to the storage system controller chip. In another embodiment, the memory 112 may also be integrated into the chip of the storage controller 100.

The memory 112 used to store soft information may be Static Random-Access Memory (SRAM), Double Data Rate RAM, or MRAM or any storage that may have a much shorter read latency than NAND device. Therefore, compared to a conventional approach of obtaining soft information from the NAND devices, for example, by re-reading data from the NAND devices, embodiments may be much faster to obtain the soft information from the memory 112. Moreover, in at least one embodiment, fetching the soft information from the memory 112 and reading the raw data from NAND device may be executed at the same time, because they are coming from different paths and these actions may be performed in parallel. For example, when data of a page are being read into the raw data buffer 106, the ECC Decoder Controller 102 may send a signal to the soft information fetcher 114 to start searching and retrieving soft information associated with the page. The parallelism may help to avoid the overhead of reading any soft information from the NAND devices.

Figure 2A:
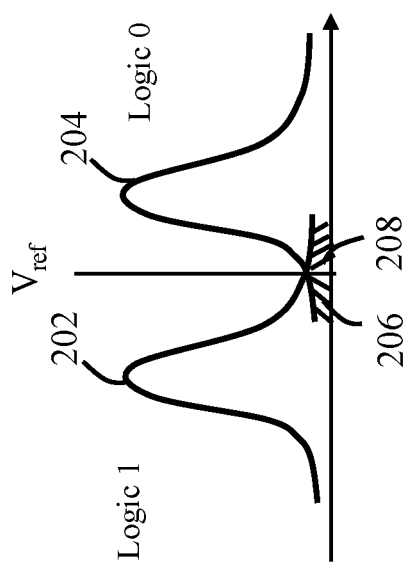
FIG. 2A, FIG. 2B and FIG. 2C schematically show the effect of shift of the threshold voltage values of NAND flash memory cells in accordance with an embodiment of the present disclosure.
Figure 2B:
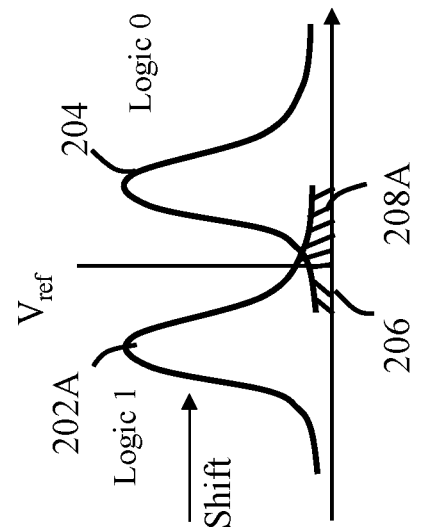
Figure 2C:
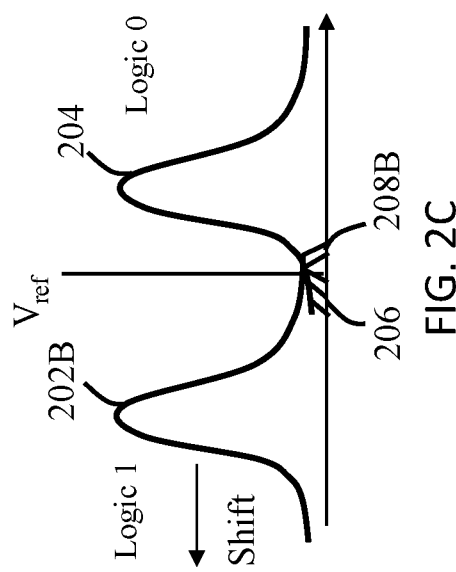

FIG. 2A, FIG. 2B and FIG. 2C schematically show the effect of shifting the threshold voltage values of NAND flash memory cells and how the soft information from one codeword may be applied to other codewords of the same page in accordance with an embodiment of the present disclosure. The horizontal axis in FIG. 2A, FIG. 2B and FIG. 2C may be the threshold voltage of storage cells in a NAND device. The vertical axis in FIG. 2A, FIG. 2B and FIG. 2C may be the probability distribution function of the threshold voltages of storage cells.

The curve 202 in FIG. 2A may indicate readout of a first logic state, for example, logic one. The curve 204 in FIG. 2A may indicate readout of a second logic state, for example, logic zero. Readout used herein may refer to any given cell's readout voltage and any given bit may be assigned a logic state by comparing this readout voltage to the reference voltage $V_{ref}$.

As shown in FIG. 2A, the curve 202 may have a tail portion 208 extending past the reference voltage $V_{ref}$ into the territory that may be regarded as in the second logic state, and the curve 204 may have a tail portion 206 extending past the reference voltage $V_{ref}$ into the territory that may be regarded as in the first logic state. That is, the correct logic state for bits with their readout in the tail portion 206 may be the second logic state but because these bits' threshold voltages are smaller than the reference voltage $V_{ref}$ they may be regarded as the first logic state. At the same time, the correct logic state for bits with their readout in the tail portion 208 may be the first logic state but because these bits' threshold voltages are larger than the reference voltage $V_{ref}$ they may be regarded as the second logic state.

In embodiments, during a decoding operation, the incorrectly labeled bits may be corrected. That is, during a decoding operation, the bits with readouts in the portion 206 that may be incorrectly labeled as logic state one may be flipped to logic state two and bits with readouts in the portion 208 that may be incorrectly labeled as logic state two may be flipped to logic state one. When the threshold voltage is not shifted, as in FIG. 2A, the sizes of the tail portions 206 and 208 may be close and the number of corrections from logic state one to logic state two may be close to the number of corrections from logic state two to logic state one.

In various embodiments, the threshold voltages of cells may shift. For example, with the increase of use (e.g., increased P/E cycles), threshold voltages of cells may tend to shift to the right. That is, the reference voltage $V_{ref}$ may not be in a good position in which the sizes of the tail portions 206 and 208 are close. FIG. 2B shows that the threshold voltages for the logic state one may be shifted to the right a little bit thus the curve 202 of FIG. 2A becomes the curve 202A in FIG. 2B. The right shift of the threshold voltages for the logic state one may cause the tail portion 208 of FIG. 2A become the tail portion 208A in FIG. 2B. Because the shift of the curve 202A is to the right, the tail portion 208A may be larger than the tail portion 208 and thus the tail portion 208A may be larger than the tail portion 206 in FIG. 2B. That is, there may be more bits with their readout voltages in the tail portion 208A than the number of bits in the tail portion 206 of FIG. 2B.

The effect of the threshold voltage shift is that there may be unbalanced corrections between the two logic states. In at least one embodiment, two flipping counts may be use. One flipping count may record how many bits are flipped from the first logic state to the second logic state (e.g., "1" to "0") and another flipping count may record how many bits are flipped from the second logic state to the first logic state (e.g., "0" to "1") during one decoding operation for one codeword. The difference between the counts of the two flipping counts may provide extra information about a NAND device, which may be used to improve ECC decoding performance.

For example, in FIG. 2B the threshold voltages for logic state one may be shifted higher and the flipping counts for logic state two (e.g., logic 0) to logic state one (e.g., logic 1) may be greater than the flipping count for logic state one (e.g., logic 1) to logic state two (e.g., logic 0) flipping. Based on the difference between the flipping counts, bits with readout values to be logic state one and bits with readout values to be logic state two may be given different reliable levels. For example, for data from a physical location, if the soft information indicates that there are more flips from logic state two to logic state one (e.g., logic 0 to 1 flip) than from logic state one to logic state two (e.g., logic 1 to 0 flip), then the logic state one may be reliable and a bit with a readout value in logic state one (e.g., logic 1) may be more reliable than a bit with a readout value in logic state two (e.g., logic 0).

It should be noted that FIG. 2B shows an example of the threshold voltages of the logic state one being shifted larger. FIG. 2C shows another example of the threshold voltages of the logic state one being shifted left (e.g., become smaller) thus the curve 202 of FIG. 2A becomes the curve 202B in FIG. 2C. The left shift of the threshold voltages for the logic state one may cause the tail portion 208 of FIG. 2A become the tail portion 208B in FIG. 2C. Because the shift of the curve 202B is to the left, the tail portion 208B may be smaller than the tail portion 208 and thus the tail portion 208B may be smaller than the tail portion 206 in FIG. 2C. That is, there may be less bits with their readout voltages in the tail portion 208B than the number of bits in the tail portion 206 of FIG. 2C.

Because in FIG. 2C, the threshold voltages for logic state one are shifted lower, the flipping count for logic state two to logic state one flipping (e.g., logic 0 to logic 1 flip) may be smaller than the flipping count for logic state one to logic state two flipping (e.g., logic 1 to logic 0 flip). In the example of FIG. 2C, a bit with a readout value in logic state two (e.g., logic 0) may be more reliable than a bit with a readout value in logic state one (e.g., logic 1).

In some embodiments, pre-defined reference values may be selected for $\overline{EFC_{1\to 0}}-\overline{EFC_{0\to 1}}$. By comparing $\overline{EFC_{1\to 0}}-\overline{EFC_{0\to 1}}$ to these pre-defined reference values, different reliable levels can be given to bit value 0 and bit value 1. If $\overline{EFC_{1\to 0}}-\overline{EFC_{0\to 1}}>0$, then bit value 0 is more reliable than bit value 1, and the magnitude of the difference may indicate how much bit value 0 may be more reliable than bit value 1. If $\overline{EFC_{1\to 0}}-\overline{EFC_{0\to 1}}<0$, then bit value 1 is more reliable than bit value 0, and the magnitude of the difference may indicate how much bit value 1 may be more reliable than bit value 0.

It should be noted that the threshold voltage shifting in FIG. 2B and FIG. 2C are examples for illustration only. In some other embodiments, the threshold voltages for the logic state two may also shift left or right. Moreover, the shapes of the curves 202 and 204 may change during a shift, for example, the curves 202 and/or 204 may become lower, wider, or both.

Figure 3:
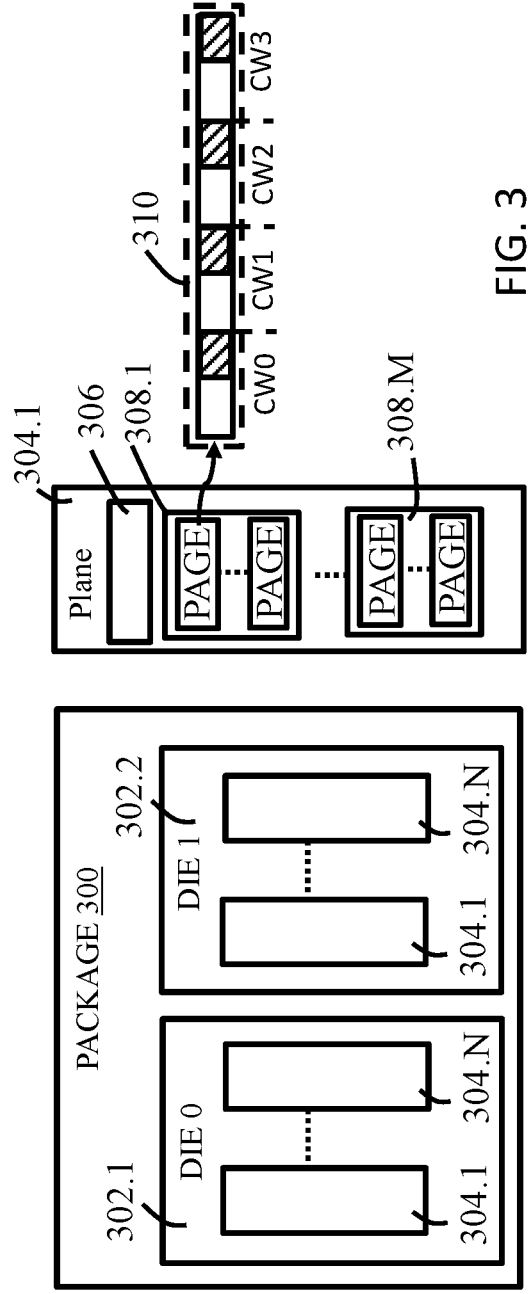
FIG. 3 schematically data storage in a non-volatile storage device in accordance with an embodiment of the present disclosure.

FIG. 3 schematically shows data storage in a non-volatile storage device 300 in accordance with an embodiment of the present disclosure. A typical non-volatile storage device may comprise one or more dies, and each die may comprise a plurality of planes. The non-volatile storage device 300 may comprise two dies 302.1 and 302.2, and each of the dies 302.1 and 302.2 may comprise a plurality of planes 304.1 to 304.N with N being a positive integer. A plane (e.g., 304.1) may comprise a register 306 and a plurality of blocks (e.g., 308.1 to 308.M). Each block may comprise a plurality of pages 310. As an example, one die may comprise 4 planes (e.g., N being 4), each plane may comprise 2048 blocks (e.g., M being 2048) and each block may comprise 64 pages. And a page may comprise a plurality of codewords, typically 4 or 8, but may be another positive integer.

The example in FIG. 3 shows a page 300 containing four codewords (e.g., codeword 0 (CW0), codeword 1 (CW1), codeword 2 (CW2) and codeword 3 (CW3). Each codeword may include user data and ECC data (e.g., the shaded portion). In one embodiment, a 16 KB NAND page may have four ECC codewords, and each codeword may contain 4 KB user data. As a page of NAND device is the minimum size unit that can be programmed, codewords in the same NAND page may share the same error characteristics (e.g., the degraded reliability of the underlying NAND flash cells with the increase of PE cycle). Therefore, soft information of reliability obtained from decoding one codeword may be used for decoding other codewords of the same page.

Figure 4:
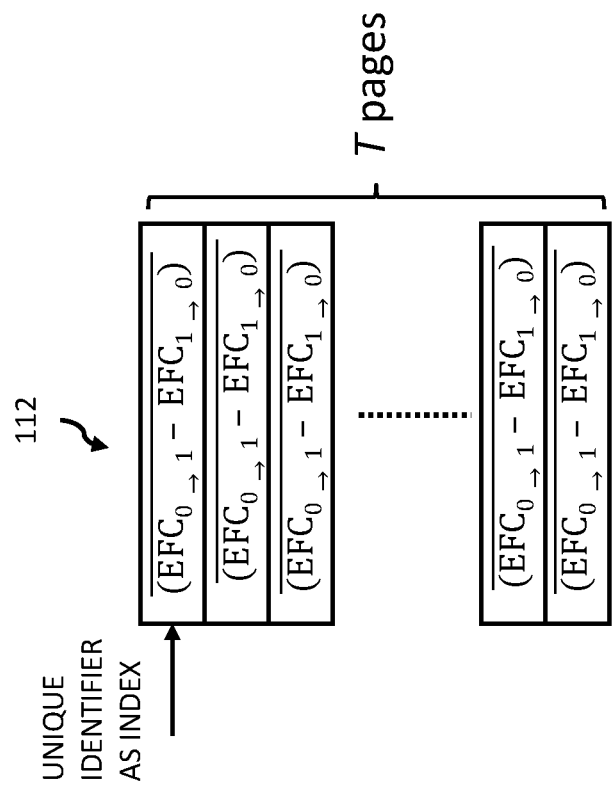
FIG. 4 schematically shows how soft information is stored in a memory in accordance with an embodiment of the present disclosure.

FIG. 4 schematically shows how soft information may be stored in the memory 112 in accordance with an embodiment of the present disclosure. In various embodiments, the memory 112 may keep the soft information (e.g., $\overline{EFC_{1\to 0}}-\overline{EFC_{0\to 1}}$) for different storage locations using a unique identifier associated with each storage location as an index. In an embodiment that the storage location is a page, the physical page address (PPA) may be used as the unique identifier.

In some embodiments, due to size limit, the memory 112 may not be able to hold soft information for all storage locations of the non-volatile storage devices of the non-volatile storage system. That is, if a lot of physical locations' soft information need to be saved, the required memory size may exceed the size of the memory 112. In some embodiments, a caching approach may be used. For example, instead of saving soft information for all NAND storage locations, soft information for a subset of NAND storage locations (e.g., a number of T pages) may be kept in the memory 112. There are various ways to choose the T storage locations. Any existing or future developed caching algorithms may be used. For example, these T storage locations may be storage locations most recently read or most recently have errors. Or the Least Recently Used (LRU) entries may be flushed. In some embodiments, the memory 112 may also store the unique identifiers for these storage locations along with the entries.

Figure 5:
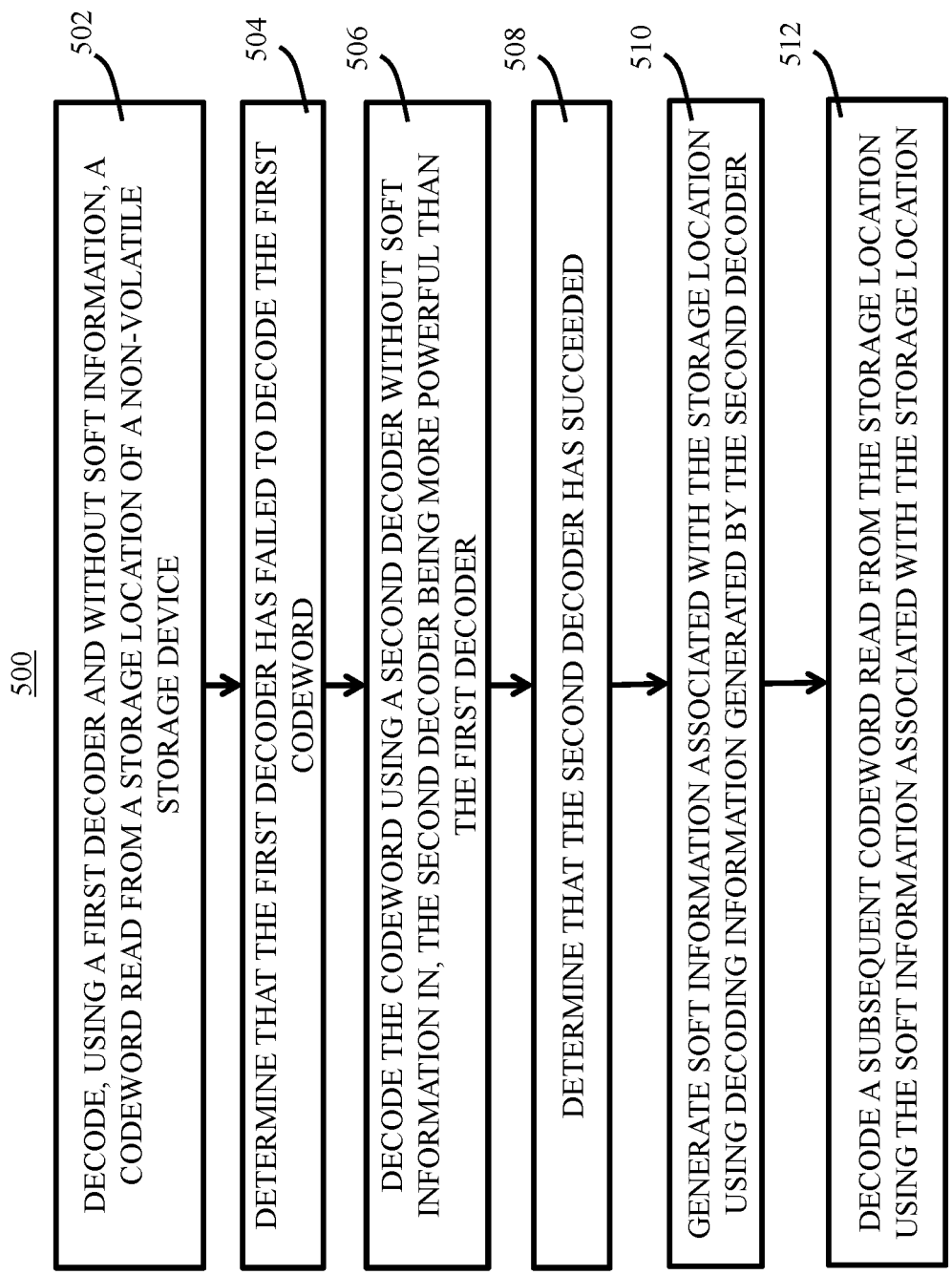
FIG. 5 is a flow diagram of a process for decoding codewords read from a storage location in accordance with an embodiment of the present disclosure.

FIG. 5 is a flow diagram of a process 500 for decoding codewords read from a storage location in accordance with an embodiment of the present disclosure. In block 502, a first codeword read from a storage location of a non-volatile storage device may be decoded using a first decoder without soft information. For example, the ECC Decoder Controller 102 may direct the first codeword to be sent to the first decoder (e.g., ECC decoder 104.1) for the first codeword to be decoded by the first decoder. The soft information fetcher 114 may search the memory 112 for soft information that may help decoding codewords from this storage location but does not find any soft information associated with the storage location. The first decoder may try to decode the first codeword without soft information.

In block 504, it may be determined that the first decoder has failed to decode the first codeword and in block 506, a second decoder may be used to decode the first codeword without soft information. For example, the first decoder may fail to decode the first codeword and the failure may let the first codeword to be sent to a second decoder (e.g., the ECC decoder 104.2), which may be more powerful than the first decoder. At this time, the memory 112 still has no soft information associated with the storage location. The second decoder may try to decode the first codeword without soft information.

In block 508, it may be determined that the second decoder has succeeded in decoding the first codeword and in block 510, soft information associated with the storage location may be generated using decoding information generated by the second decoder. For example, the second decoder may successfully decode the first codeword in a second decoding operation and generate decoding information such as the error flipping count for 0 to 1 and error flipping count for 1 to 0. The decoding information may be sent to the soft information generator 116. The soft information generator 116 may generate soft information, for example, $EFC_{1->0}$ minus $EFC_{0->1}$ (e.g., $EFC_{1->0}-EFC_{0->1}$) to indicate whether and how much one state may be more reliable than the other state.

In block 512, a subsequent codeword from the storage location may be decoded using the soft information associated with the storage location. Whenever the soft information associated with the storage location is generated and saved to the memory 112, it becomes available for decoding any subsequent codeword from the same physical location. For example, if the subsequent codeword is tried to be decoded by the first decoder after the soft information becomes available, the soft information fetcher 114 may fetch the soft information and fed it to the first decoder, and the first decoder may decode the subsequent codeword successfully using the soft information. Because codewords read from the same storage location (e.g., the same page) may share the same error characteristics, the soft information may be used by the first decoder (e.g., a less powerful decoder) to decode subsequent codeword(s) read from the same location. If, however, the subsequent codeword has already been escalated from the first decoder to a higher-level decoder when the soft information becomes available, the soft information fetcher 114 may fetch the soft information and fed it to the higher-level decoder, the higher-level decoder may use the soft information to decode the subsequent codeword successfully.

Embodiments of the processes disclosed herein (including the process 500) may be implemented using software (e.g., executable by a computer processor (e.g., a central processing unit (CPU), a graphics processing unit (GPU), or both)), hardware (e.g., a field-programmable gate array (FPGA) or an application-specific IC (ASIC), firmware, or any suitable combination of the three.

In one embodiment, for example, some or all of the disclosed methods and operations may be implemented in software comprising computer-executable instructions stored on one or more computer-readable storage media. The one or more computer-readable storage media may include non-transitory computer-readable media (such as removable or non-removable magnetic disks, magnetic tapes or cassettes, solid state drives (SSDs), hybrid hard drives, CD-ROMs, CD-RWs, DVDs, or any other tangible storage medium), volatile memory components (such as DRAM or SRAM), or nonvolatile memory components (such as hard drives)). The computer-executable instructions may be executed on a computer (e.g., any commercially available computer, including smart phones or other mobile devices that include computing hardware) by a computer processor (e.g., a CPU, a GPU, or both).

In an exemplary embodiment, there is provided a method that may comprise: decoding a first codeword read from a storage location of a non-volatile storage device using a first decoder without soft information, determining that the first decoder has failed to decode the first codeword, decoding the first codeword using a second decoder without soft information, determining that the second decoder has succeeded in decoding the first codeword, generating soft information associated with the storage location using decoding information generated by the second decoder and decoding a subsequent codeword from the storage location using the soft information associated with the storage location. The second decoder may be more powerful than the first decoder.

In one embodiment, the method may further comprise searching a memory for soft information and determining that there is not soft information available for the first decoder to use for decoding the first codeword.

In one embodiment, the method may further comprise storing the soft information associated with the storage location to a memory using a unique identifier for the storage location as an index, and retrieving the soft information associated with the storage location for decoding the subsequent codeword.

In one embodiment, the method may further comprise updating the soft information associated with the storage location using decoding information generated by decoding the subsequent codeword.

In one embodiment, the storage location may be a page and the unique identifier may be a physical page address (PPA).

In one embodiment, the soft information may indicate whether one logic state is more reliable than another logic state and may be presented as a difference between an error flipping count of state 1 to state 0 and an error flipping count of state 0 to state 1.

In one embodiment, the method may further comprise caching the soft information associated with the storage location in a memory with a caching algorithm.

In another embodiment, there is provided a storage system controller that may comprise a plurality of error-correcting code (ECC) decoders including a first decoder and a second decoder, an ECC decoder controller and a soft information generator. The second decoder may be more powerful than the first decoder. The ECC decoder controller may be configured to: direct a first codeword read from a storage location of a non-volatile storage device to the first decoder for the first codeword to be decoded by the first decoder without soft information, determine that the first decoder has failed to decode the first codeword, direct the first codeword to the second decoder for the first codeword to be decoded by the second decoder without soft information, and determine that the second decoder has succeeded in decoding the first codeword. The soft information generator may be configured to generate soft information associated with the storage location using decoding information generated by the second decoder. One of the plurality of decoders may be configured to decode a subsequent codeword from the storage location using the soft information associated with the storage location generated by the soft information generator.

In one embodiment, the storage system controller may further comprise a soft information retriever configured to search a memory for soft information and determine that there is not soft information available for the first decoder to use for decoding the first codeword.

In one embodiment, the storage system controller may further comprise a soft information retriever. The soft information generator may be further configured to store the soft information associated with the storage location to a memory using a unique identifier for the storage location as an index, and the soft information retriever may be configured to retrieve the soft information associated with the storage location for decoding the subsequent codeword.

In one embodiment, the soft information generator may be further configured to update the soft information associated with the storage location using decoding information generated by decoding the subsequent codeword.

In one embodiment, the storage location may be a page and the unique identifier may be a physical page address (PPA).

In one embodiment, the soft information associated with the storage location may indicate whether one logic state is more reliable than another logic state and may be presented as a difference between an error flipping count of state 1 to state 0 and an error flipping count of state 0 to state 1.

In one embodiment, the storage system controller may further comprise a memory configured to cache the soft information associated with the storage location with a caching algorithm.

In yet another exemplary embodiment, disclosed herein may also include a non-transitory machine-readable medium having executable instructions. The executable instructions, when executed by a storage controller, may cause the storage controller to: decode a first codeword read from a storage location of a non-volatile storage device using a first decoder without soft information, determine that the first decoder has failed to decode the first codeword, decode the first codeword using a second decoder without soft information, determine that the second decoder has succeeded in decoding the first codeword, generate soft information associated with the storage location using decoding information generated by the second decoder and decode a subsequent codeword from the storage location using the soft information associated with the storage location. The second decoder may be more powerful than the first decoder, In one embodiment, the executable instructions, when executed by the storage controller, may further cause the storage controller to search a memory for soft information and determine that there is not soft information available for the first decoder to use for decoding the first codeword.

In one embodiment, the executable instructions, when executed by the storage controller, may further cause the storage controller to: store the soft information associated with the storage location to a memory using a unique identifier for the storage location as an index and retrieve the soft information associated with the storage location for decoding the subsequent codeword.

In one embodiment, the executable instructions, when executed by the storage controller, may further cause the storage controller to update the soft information associated with the storage location using decoding information generated by decoding the subsequent codeword.

In one embodiment, the storage location may be a page and the unique identifier may be a physical page address (PPA).

In one embodiment, the soft information may indicate whether one logic state is more reliable than another logic state and may be presented as a difference between an error flipping count of state 1 to state 0 and an error flipping count of state 0 to state 1.

Embodiments according to the present disclosure, may be implemented for any types of ECC codes, such as, but not limited to, rectangular parity, LDPC and Hamming code.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
   decoding a first codeword read from a storage location of a non-volatile storage device using a first decoder without using soft information associated with the storage location;
   upon determining that the first decoder has failed to decode the first codeword, decoding the first codeword using a second decoder;
   upon determining that the second decoder has succeeded in decoding the first codeword, generating the soft information using decoding information generated by the second decoder; and
   decoding a subsequent codeword from the storage location using the soft information.

2. The method of claim 1, further comprising searching a memory for the soft information.

3. The method of claim 1, further comprising:
   storing the soft information to a memory using a unique identifier for the storage location as an index; and
   retrieving the soft information for decoding the subsequent codeword.

4. The method of claim 3, further comprising updating the soft information using decoding information generated by decoding the subsequent codeword.

5. The method of claim 3, wherein the storage location is a page and the unique identifier is a physical page address (PPA).

6. The method of claim 1, wherein the soft information indicates whether one logic state is more reliable than another logic state.

7. The method of claim 1, further comprising caching the soft information associated with the storage location in a memory with a caching algorithm.

8. A storage system controller, comprising:
a plurality of decoders including a first decoder and a second decoder;
a decoder controller configured to:
  direct a first codeword read from a storage location of a non-volatile storage device to the first decoder,
  determine, that the first decoder has failed to decode the first codeword without using soft information associated with the storage location,
  direct the first codeword to the second decoder, and
  determine, that the second decoder has succeeded in decoding the first codeword; and
a soft information generator configured to generate the soft information using decoding information generated by the second decoder, wherein the plurality of decoders are configured to decode a subsequent codeword from the storage location using the soft information.

9. The storage system controller of claim 8, further comprising a soft information retriever configured to search a memory for the soft information.

10. The storage system controller of claim 8, wherein the soft information generator is further configured to store the soft information to a memory using a unique identifier for the storage location as an index.

11. The storage system controller of claim 10, wherein the soft information generator is further configured to update the soft information using decoding information generated by decoding the subsequent codeword.

12. The storage system controller of claim 10, wherein the storage location is a page and the unique identifier is a physical page address (PPA).

13. The storage system controller of claim 8, wherein the soft information indicates whether one logic state is more reliable than another logic state.

14. The storage system controller of claim 8, further comprising a memory configured to cache the soft information associated with the storage location with a caching algorithm.

15. A non-transitory machine-readable medium having executable instructions, wherein the executable instructions, when executed by a storage controller, causes the storage controller to:
  decode a first codeword read from a storage location of a non-volatile storage device using a first decoder without using soft information associated with the storage location;
  upon determining that the first decoder has failed to decode the first codeword, decode the first codeword using a second decoder;
  upon determining that the second decoder has succeeded in decoding the first codeword, generate the soft information using decoding information generated by the second decoder; and
  decode a subsequent codeword from the storage location using the soft information.

16. The non-transitory machine-readable medium of claim 15, wherein the executable instructions, when executed by the storage controller, further causes the storage controller to search a memory for the soft information.

17. The non-transitory machine-readable medium of claim 15, wherein the executable instructions, when executed by the storage controller, further causes the storage controller to:
  store the soft information to a memory using a unique identifier for the storage location as an index; and
  retrieve the soft information for decoding the subsequent codeword.

18. The non-transitory machine-readable medium of claim 17, wherein the executable instructions, when executed by the storage controller, further causes the storage controller to update the soft information using decoding information generated by decoding the subsequent codeword.

19. The non-transitory machine-readable medium of claim 17, wherein the storage location is a page and the unique identifier is a physical page address (PPA).

20. The non-transitory machine-readable medium of claim 15, wherein the soft information indicates whether one logic state is more reliable than another logic state.

* * * * *